(12) United States Patent
Wang et al.

(10) Patent No.: US 10,757,797 B2
(45) Date of Patent: *Aug. 25, 2020

(54) METHOD AND APPARATUS FOR GAS ABATEMENT

(71) Applicant: Applied Materials, Inc., Santa Clara, CA (US)

(72) Inventors: Rongping Wang, Cupertino, CA (US); Jibing Zeng, San Jose, CA (US); David Muquing Hou, Cupertino, CA (US); Michael S. Cox, Gilroy, CA (US); Zheng Yuan, Santa Clara, CA (US); James L'Heureux, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/206,276

(22) Filed: Nov. 30, 2018

(65) Prior Publication Data

US 2019/0246481 A1 Aug. 8, 2019

Related U.S. Application Data

(63) Continuation of application No. 15/147,974, filed on May 6, 2016, now Pat. No. 10,187,966.

(Continued)

(51) Int. Cl.
*H05H 1/24* (2006.01)
*H01J 37/32* (2006.01)
(Continued)

(52) U.S. Cl.
CPC ....... *H05H 1/2406* (2013.01); *C23C 16/4412* (2013.01); *C23C 16/507* (2013.01);
(Continued)

(58) Field of Classification Search
None
See application file for complete search history.

(56) References Cited

U.S. PATENT DOCUMENTS

| | | | |
|---|---|---|---|
| 6,187,072 B1 * | 2/2001 | Cheung | B01D 45/06 118/715 |
| 6,193,802 B1 * | 2/2001 | Pang | B01D 45/06 118/715 |

(Continued)

FOREIGN PATENT DOCUMENTS

| | | |
|---|---|---|
| CN | 101390187 A | 3/2009 |
| JP | H0696967 A | 4/1994 |

(Continued)

OTHER PUBLICATIONS

PCT Notification of Transmittal of the International Search Report and the Written Opinion of the International Searching Authority for International Application No. PCT/US2016/032091; dated Aug. 9, 2016; 12 total pages.

(Continued)

*Primary Examiner* — Alexander H Taningco
*Assistant Examiner* — Srinivas Sathiraju
(74) *Attorney, Agent, or Firm* — Patterson + Sheridan, LLP

(57) ABSTRACT

Embodiments disclosed herein include a plasma source, an abatement system and a vacuum processing system for abating compounds produced in semiconductor processes. In one embodiment, a plasma source includes a dielectric tube and a coil antenna surrounding the tube. The coil antenna includes a plurality of turns, and at least one turn is shorted. Selectively shorting one or more turns of the coil antenna helps reduce the inductance of the coil antenna, allowing higher power to be supplied to the coil antenna that covers more processing volume. Higher power supplied to (Continued)

the coil antenna and larger processing volume lead to an improved DRE.

18 Claims, 5 Drawing Sheets

Related U.S. Application Data

(60) Provisional application No. 62/196,549, filed on Jul. 24, 2015.

(51) Int. Cl.
*H05H 1/46* (2006.01)
*C23C 16/507* (2006.01)
*C23C 16/44* (2006.01)

(52) U.S. Cl.
CPC ......... *H01J 37/321* (2013.01); *H01J 37/3211* (2013.01); *H01J 37/32348* (2013.01); *H01J 37/32357* (2013.01); *H01J 37/32844* (2013.01); *H05H 1/46* (2013.01); *H01J 2237/022* (2013.01); *H01J 2237/327* (2013.01); *H01J 2237/335* (2013.01); *H05H 2001/2468* (2013.01); *H05H 2001/4667* (2013.01); *H05H 2245/123* (2013.01); *H05H 2245/1225* (2013.01)

(56) References Cited

U.S. PATENT DOCUMENTS

| | | | |
|---|---|---|---|
| 6,291,938 B1 | 9/2001 | Jewett et al. | |
| 6,315,872 B1* | 11/2001 | Pavate | C23C 14/3414 204/192.12 |
| 6,367,412 B1 | 4/2002 | Ramaswamy et al. | |
| 6,463,875 B1* | 10/2002 | Chen | H01J 37/321 |
| 8,480,914 B2 | 7/2013 | Brcka | |
| 8,736,177 B2 | 5/2014 | Zhang | |
| 9,066,413 B2* | 6/2015 | Chang | H01J 37/321 |
| 9,240,308 B2* | 1/2016 | Cox | H01J 37/32669 |
| 9,247,629 B2 | 1/2016 | Vahidpour et al. | |
| 9,378,928 B2* | 6/2016 | Zeng | H05H 1/30 |
| 9,649,592 B2* | 5/2017 | Cox | B01D 53/64 |
| 10,187,966 B2* | 1/2019 | Wang | H05H 1/2406 |
| 2003/0067273 A1* | 4/2003 | Benjamin | H01J 37/321 315/111.21 |
| 2005/0194099 A1 | 9/2005 | Jewett, Jr. et al. | |
| 2006/0081185 A1* | 4/2006 | Mauck | H01J 37/321 |
| 2007/0170867 A1* | 7/2007 | Persing | H01J 37/321 315/111.21 |
| 2007/0284242 A1* | 12/2007 | Moisan | B01D 53/32 204/165 |
| 2008/0134757 A1* | 6/2008 | Chen | B81C 1/00587 73/25.05 |
| 2008/0210378 A1* | 9/2008 | Lee | H01J 37/321 156/345.49 |
| 2012/0279657 A1* | 11/2012 | Srivastava | C23C 16/4412 156/345.29 |
| 2013/0146225 A1* | 6/2013 | Chen | H01J 37/32449 156/345.33 |
| 2013/0284724 A1* | 10/2013 | Cox | H01J 37/32844 219/635 |
| 2014/0077700 A1* | 3/2014 | Chang | H01J 37/321 315/111.51 |
| 2015/0228513 A1* | 8/2015 | Parkhe | H01L 21/67103 219/444.1 |
| 2015/0255251 A1* | 9/2015 | Cox | H01J 37/165 313/32 |
| 2015/0255256 A1* | 9/2015 | Cox | H01J 37/32669 156/345.29 |
| 2015/0279626 A1* | 10/2015 | Chen | H01J 37/32229 315/111.51 |
| 2015/0318148 A1* | 11/2015 | Chen | H01J 37/32229 315/39 |
| 2015/0348754 A1* | 12/2015 | Zeng | H01J 37/32467 315/34 |
| 2015/0371823 A1* | 12/2015 | Eom | H01J 37/32119 118/723 I |
| 2017/0027049 A1* | 1/2017 | Wang | H05H 1/2406 |

FOREIGN PATENT DOCUMENTS

| | | |
|---|---|---|
| JP | 2008-290022 A | 12/2008 |
| JP | 2013-093265 A | 5/2013 |
| TW | 200733821 A | 9/2007 |
| TW | 201334023 A1 | 8/2013 |
| WO | 2007/087210 A1 | 8/2007 |

OTHER PUBLICATIONS

Taiwanese Office Action (with attached English translation) for Application No. 105116031; dated Dec. 13, 2018; 11 total pages.
Chinese Office Action (with attached English translation) for Application No. 201680043524.6; dated Mar. 18, 2019; 14 total pages.
European Patent Office; Extended Search Report for Application No. 16830965.6; dated Mar. 8, 2019; 9 total pages.

* cited by examiner

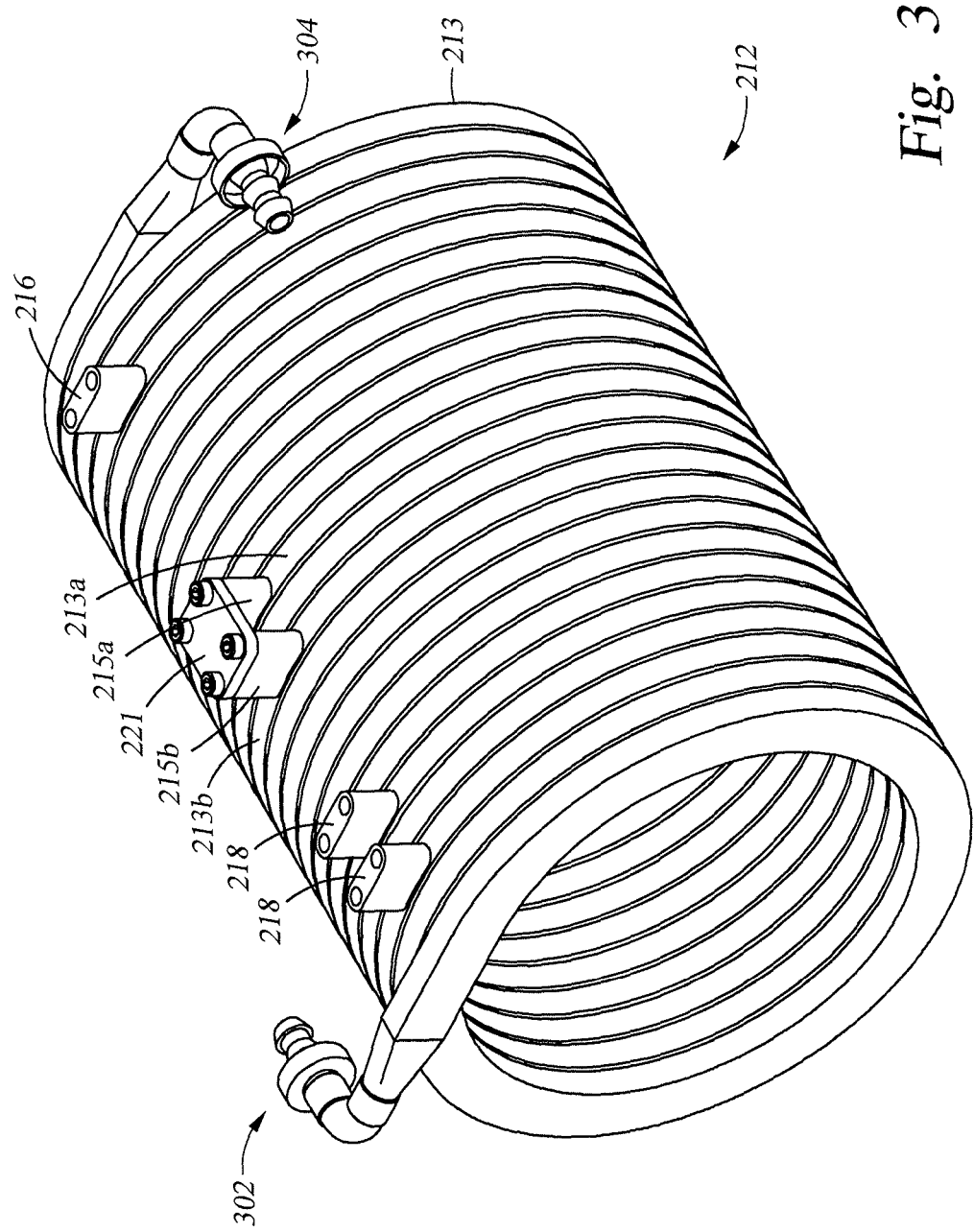

METHOD AND APPARATUS FOR GAS ABATEMENT

CROSS-REFERENCE TO RELATED APPLICATIONS

This application is a continuation application of co-pending U.S. patent application Ser. No. 15/147,974, filed on May 6, 2016, which claims benefit of U.S. Provisional Patent Application Ser. No. 62/196,549, filed on Jul. 24, 2015. Each of aforementioned patent applications are incorporated herein by reference.

BACKGROUND

Field

Embodiments of the present disclosure generally relate to semiconductor processing equipment. More particularly, embodiments of the present disclosure relate to a plasma source, an abatement system, and vacuum processing system for abating compounds produced in semiconductor processes.

Description of the Related Art

The processes used by semiconductor processing facilities produce many compounds, such as perfluorinated compounds (PFCs), which are abated or treated before disposal, due to regulatory requirements and environmental and safety concerns. Typically, a remote plasma source may be coupled to a processing chamber to abate the compounds exiting the processing chamber. High density inductively coupled plasma (ICP) may be used as the remote plasma source in abatement of PFCs in some cases.

An ICP remote plasma source may include a coil antenna surrounding a dielectric tube, and the coil antenna may be large enough to surround the entire tube in order to provide the PFCs enough residence time inside the tube. However, a large coil antenna can be impractical since large coil antennas have large inductance, which can cause the power source for the antenna to operate in a non-optimal current-voltage area, leading to "foldback" of the output of the power source due to either a current or voltage limit. As a result, the destruction and removal efficiency (DRE) of PFCs in a conventional ICP remote plasma source typically is around 50%. In addition, as frequency increases, a large inductor, such as the large coil antenna, can carry high potential, causing a more pronounced stray effect (capacitively coupling instead of inductively coupling).

Therefore, an improved plasma source and abatement system is needed for abating compounds in semiconductor processes.

SUMMARY

Embodiments disclosed herein include a plasma source, an abatement system and a vacuum processing system for abating compounds produced in semiconductor processes. In one embodiment, a plasma source includes a dielectric tube and a coil antenna surrounding the tube. The coil antenna includes a plurality of turns, and at least one turn is shorted. Selectively shorting one or more turns of the coil antenna helps reduce the inductance of the coil antenna, allowing higher power to be supplied to the coil antenna that covers more processing volume. Higher power supplied to the coil antenna and larger processing volume lead to an improved DRE.

In one embodiment, a plasma source includes a dielectric tube and a coil antenna surrounding the dielectric tube. The coil antenna includes a plurality of turns, and at least one turn of the plurality of turns is shorted.

In another embodiment, an abatement system includes a power source and a plasma source. The plasma source includes a dielectric tube having an inlet and an outlet, and a coil antenna surrounding the dielectric tube. The coil antenna includes a plurality of turns, and at least one turn of the plurality of turns is shorted.

In another embodiment, a vacuum processing system includes a vacuum processing chamber and a plasma source. The plasma source includes a dielectric tube having an inlet and an outlet, and a coil antenna surrounding the dielectric tube. The coil antenna includes a plurality of turns, and at least one turn of the plurality of turns is shorted.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a perspective view of a coil antenna of the plasma source of FIG. 1, according to an embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
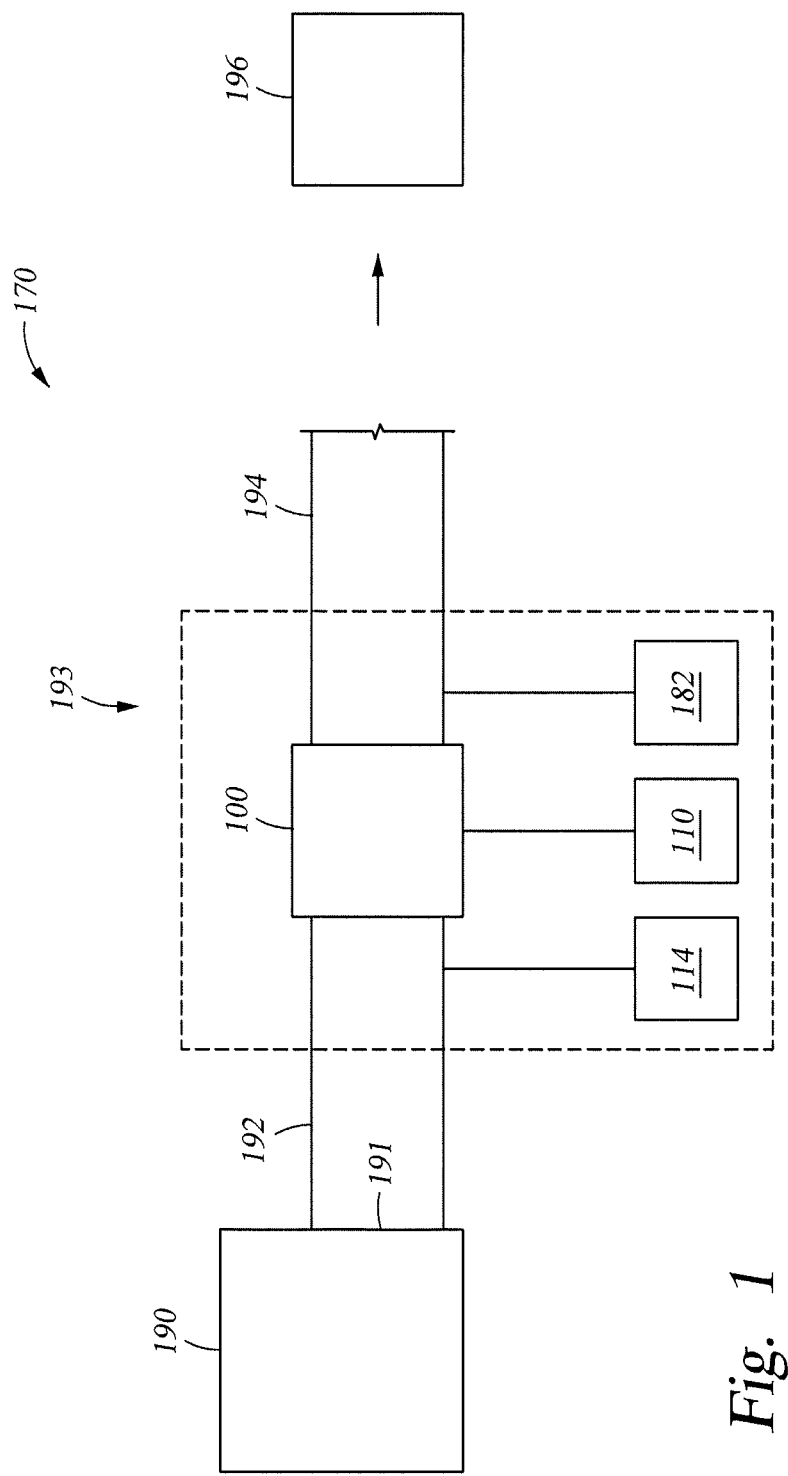
FIG. 1 is a schematic side view of a vacuum processing system having a plasma source, according to an embodiment described herein.

FIG. 1 is a schematic side view of a vacuum processing system 170 having a plasma source 100 utilized in an abatement system 193. The vacuum processing system 170 includes at least a vacuum processing chamber 190 and the abatement system 193. The abatement system 193 includes at least the plasma source 100. The vacuum processing chamber 190 is generally configured to perform at least one integrated circuit manufacturing process, such as a deposition process, an etch process, a plasma treatment process, a preclean process, an ion implant process, or other electronic device manufacturing process. The process performed in the vacuum processing chamber 190 may be plasma assisted. For example, the process performed in the vacuum processing chamber 190 may be plasma etch process for removing a silicon-based material.

The vacuum processing chamber 190 has a chamber exhaust port 191 coupled to the plasma source 100 of the abatement system 193 via a foreline 192. An exhaust of the plasma source 100 is coupled by an exhaust conduit 194 to pumps and a facility exhaust system, schematically indicated by a single reference numeral 196 in FIG. 1. The pumps are generally utilized to evacuate the vacuum processing chamber 190, while the facility exhaust generally includes scrubbers or other exhaust cleaning apparatus for preparing the effluent of the vacuum processing chamber 190 to enter the atmosphere.

The plasma source 100 is utilized to perform an abatement process on compounds, such as gases and/or other materials exiting the vacuum processing chamber 190, so that such gases and/or other materials may be converted into a more environmentally and/or process equipment friendly composition. A power source 110 may be coupled to the plasma source 100 for supplying power to the plasma source 100. The power source 110 may be a radio frequency (RF) power source and may provide RF energy at a predetermined frequency sufficient to form a plasma within the plasma source 100 such that gases and/or other materials flowing through the plasma source 100 are treated with the plasma (e.g., at least partially broken down into one or more of ions, radicals, elements, or smaller molecules). The RF energy may be greater than 3 kW, such as 6 kW. The frequency of the RF energy may range from about 10 kHz to about 60 MHz.

In some embodiments, the abatement system 193 also includes an abating reagent source 114. The abating reagent source 114 may be coupled to at least one of the foreline 192 or the plasma source 100. The abating reagent source 114 provides an abatement reagent into the plasma source 100 which may be energized to assist converting the compounds exiting the vacuum processing chamber 190 into a more environmentally and/or process equipment friendly composition. Examples of the abatement reagent include $H_2$, $O_2$, $H_2O$, and other suitable abatement reagents.

Optionally, a pressure regulating module 182 may be coupled to at least one of the plasma source 100 or exhaust conduit 194. The pressure regulating module 182 injects a pressure regulating gas, such as Ar, N, or other suitable gas which allows the pressure within the plasma source 100 to be better controlled, and thereby provide more efficient abatement performance. In one example, the pressure regulating module 182 is a part of the abatement system 193. The pressure within the plasma source 100 may range from about 10 mTorr to about a few Torrs.

Figure 2A:
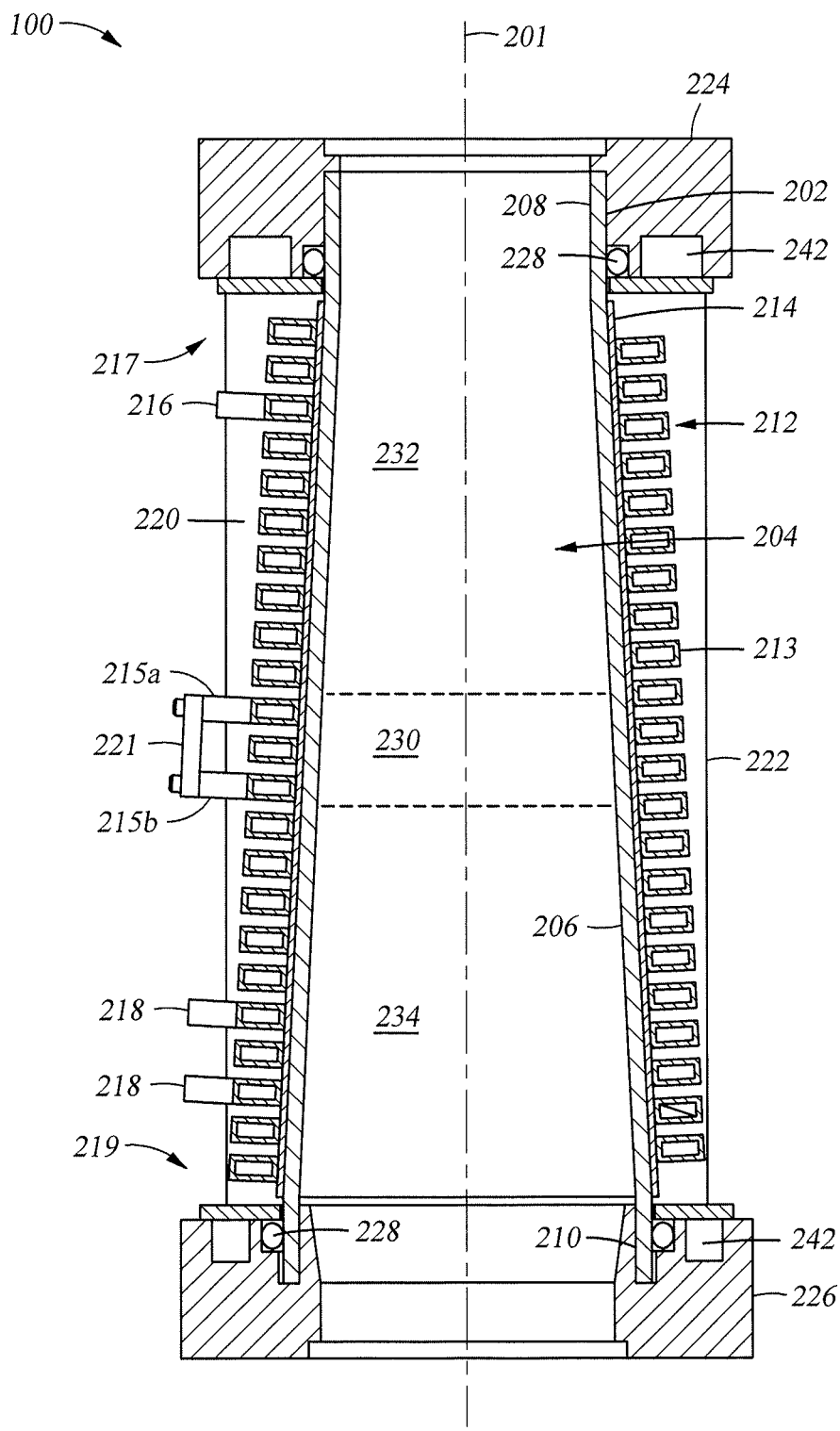
FIGS. 2A-2B are cross sectional side views of the plasma source of FIG. 1, according to embodiments described herein.

FIG. 2A is a cross sectional side view of the plasma source 100 of FIG. 1, according to embodiments described herein. The plasma source 100 includes a dielectric tube 202 having an inner volume 204 and a coil antenna 212 surrounding the dielectric tube 202 to inductively couple RF energy into the inner volume 204 during processing to excite compounds traveling therethrough. The dielectric tube 202 may have a conical side wall 206 that terminates with a first straight end portion 208 and a second straight end portion 210. The conical side wall 206 may be disposed at an angle with respect to a central axis 201 of the dielectric tube 202 of about 1 to about 5 degrees, such as about 2 degrees. The straight end portions 208, 210 facilitate coupling with conduits, such as the foreline 192 and the exhaust conduit 194, to facilitate flow of compounds through the plasma source 100. The first straight end portion 208 may be an inlet of the dielectric tube 202 allowing compounds exiting the vacuum processing chamber 190 flowing into the dielectric tube 202, and the second straight end portion 210 may be an outlet of the dielectric tube 202 allowing treated compounds flowing out of the dielectric tube 202. The dielectric tube 202 may be fabricated from any dielectric material suitable to allow the transmission of RF power to the inner volume 204.

The dielectric tube 202 may have any dimensions suitable to allow the flow of compounds from the foreline 192 and through the dielectric tube 202 and establish the necessary residence time for treatment. For example, in some embodiments, the dielectric tube 202 may have a length of about 6 to about 15 inches. The side wall 206 of the dielectric tube 202 may have a thickness suitable to provide mechanical strength and efficient RF coupling. A thicker side wall 206 will provide extended service lifetime, but with a lower power coupling efficiency. In some embodiments, the side wall 206 has a thickness ranging from about 0.1 inches to about 0.5 inches, such as about 0.125 inches.

The coil antenna 212 may be wrapped around the side wall 206 of the dielectric tube 202, and may have the same shape as the dielectric tube 202. In one embodiment, both the dielectric tube 202 and the coil antenna 212 are conical. The coil antenna 212 may include a plurality of turns 213. In some embodiments, the coil antenna 212 may have about 5 to 25 turns. In one embodiment, as shown in FIG. 2A, the coil antenna 212 has 22 turns. In some embodiments, each turn may be disposed about 0.25 inches to about 0.75 inches away from adjacent turns. The coil antenna 212 may be fabricated from a hollow tube of a suitable RF and thermally conductive material. In some embodiments, the coil antenna 212 is fabricated from electrical grade copper tubing, such as #60 tubing, although other sizes may be used. The coil antenna 212 may have one of various cross-sections, such as circular, square, or flattened circular. A coolant may be provided to the hollow tube to facilitate thermal regulation, e.g., cooling, of the coil antenna 212 during processing. The coil antenna 212 may have any shape suitable for igniting and sustaining a plasma within the dielectric tube 202. The coil antenna 212 may be helical, tapered, domed, or planar. One or more first terminals 216 may be disposed at a first end 217 of the coil antenna 212 to facilitate coupling RF power to the coil antenna 212. One or more second terminals 218 may be disposed at a second end 219 of the coil antenna 212 to facilitate coupling RF power to the coil antenna 212. The second terminals 218 may be also coupled to ground. In one embodiment, the first terminals 216 and the second terminals 218 are connected to the power source 110.

For a coil antenna, the inductance of the coil antenna is proportional to the square of the number of turns the coil antenna has. In order to reduce the inductance of the coil antenna 212, one or more turns of the coil antenna 212 may be shorted. The term "shorted" used herein is defined as connecting portions of a coil with an electrical grade conducting material that is not part of the coil. For example, a coil antenna having 15 turns has an inductance proportional to $15^2$, or 225. A coil antenna having 15 turns with the $6^{th}$ and $7^{th}$ turns connected by an electrical grade conducting material (i.e., shorting one turn) has an inductance proportional to $6^2+8^2$, or 100. Thus, the inductance of a coil antenna having shorted at least one turn is much less than the inductance of a coil antenna having same number of turns but without the shorted turn. Less inductance allows an increased power to be supplied to the coil antenna, leading to an improved DRE. The DRE for coil antenna having shorted turns and working at high RF power, such as about 6 kW, is above 95%. As shown in FIG. 2A, a third terminal 215a may be connected to the $10^{th}$ turn of the coil antenna 212, and a fourth terminal 215b may be connected to the $12^{th}$ turn of the coil antenna 212. A metal connector 221 may be connected to the third terminal 215a and the fourth terminal 215b in order to short two turns (first turn between $10^{th}$ and $11^{th}$ turns and second turn between $11^{th}$ and $12^{th}$ turns). The third terminal 215a, the fourth terminal 215b, and the metal connector 221 may be made of an electrical grade conductive material. In one embodiment, the metal connector 221 is made of copper, brass, aluminum, or other suitable metal, and has a thickness ranging from about 0.01 inches to about 0.2 inches, such as about 0.125 inches. In some embodiments, two adjacent turns may be connected with the metal connector 221, and one turn (between adjacent turns) is shorted. In some embodiments, two turns with one or more turns in between may be connected with the metal connector 221, and two or more turns are shorted. The third terminal 215a, the fourth terminal 215b, and the metal connector 221 are used to short one or more turns of the coil antenna 212. Other methods and devices may be used to short one or more turns. For example, a metal member may be electrically coupled to turns to short the turns. In one embodiment, the metal member may be welded to the turns 213.

During processing, when an RF power is supplied to the coil antenna 212 from the power source 110 via the terminals 216, 218, a field 230 is created as the result of shorting the turns with the metal connector 221 at the location of the short. The field 230 is defined in the area surrounded by the turns that are shorted, and the field 230 does not have a magnetic field strong enough to generate a plasma. In other words, the field 230 acts as a buffer for the magnetic field created inside the dielectric tube 202, dividing the plasma into a first plasma zone 232 and a second plasma zone 234. No plasma is formed in the dielectric tube 202 where the field 230 is formed. The number of shorts and the location can be used to tune the number and location of the plasma zones within the dielectric tube 202. For example, in one embodiment, a first portion of the coil antenna 212 surrounding the first plasma zone 232 has less turns than a second portion of the coil antenna 212 surrounding the second plasma zone 234. More turns means the second portion of the coil antenna 212 has a higher inductance, which also leads to a denser plasma in the second plasma zone 234. In order to efficiently cool the coil antenna 212, a coolant may be flowed through the coil antenna 212 from the bottom to the top of the coil antenna 212, such as from the second portion surrounding the second plasma zone 234 to the first portion surrounding the first plasma zone 232. In some embodiments, the number of turns for both the first and second portions of the coil antenna 212 is the same. In some embodiments, the number of turns surrounding the first plasma zone 232 is greater than the number of turns surrounding the second plasma zone 234. In some embodiments, two turns are connected in a first pair with a first metal connector 221 at a first location on the coil antenna 212, and two other turns are connected in a second pair with a second metal connector 221 at a second location, different from the first location, on the coil antenna 212 in order to create three plasma zones. More plasma zones may be formed by connecting more pairs of turns. Compounds flow through the plasma zones in cascades, and the resident time is a function of the number of zones.

With more than one plasma zone inside the dielectric tube 202, the temperature within the dielectric tube 202 may vary based on the location. For example, in one embodiment, the temperature at the first straight end portion 208 during processing may be about 40 degrees Celsius, and the temperature at the second straight end portion 210 during processing may be about 120 degrees Celsius. The large difference in temperature within the dielectric tube 202 causes the dielectric tube 202 to have large differences in temperature at different locations. Different temperatures at different locations of the dielectric tube 202 impose a thermal stress on the dielectric tube 202, which can lead to cracking of the dielectric tube 202. In order to prevent the dielectric tube 202 from cracking, the dielectric tube 202 may be made of aluminum nitride. Aluminum nitride has a thermal conductivity of up to 285 W/m*K, compare to aluminum oxide, a material conventionally used for the dielectric tube, which has a thermal conductivity of up to 30 W/m*K. High thermal conductivity of aluminum nitride reduces temperature gradients in the dielectric tube 202, reduces stresses on the dielectric tube 202, and prevents breakage of the dielectric tube 202.

Additionally, by using the dielectric tube 202 made of aluminum nitride, an unexpected result of a reduction in discharge voltage is achieved. In some embodiments, the discharge voltage of the plasma source 100 including the dielectric tube 202 made of aluminum nitride is about 20 percent less than the discharge voltage of a plasma source including a dielectric tube made of aluminum oxide. Other properties, such as dielectric constant and loss tangent, of aluminum nitride are similar to those of aluminum oxide. Lowered discharge voltage would be advantageous in lowering capacitive-coupling driven erosion of the dielectric tube 202 by corrosive species, such as fluorine, chlorine, hydrogen, etc.

Other materials, such as quartz and sapphire, may be used for the dielectric tube 202. Quartz and sapphire both have higher thermal conductivities than the thermal conductivity of aluminum oxide, but less than the thermal conductivity of aluminum nitride. In addition, quartz and sapphire may not be suitable for certain chemistry since quartz and sapphire are not as resistant to a specific chemistry as aluminum nitride. Sapphire may be used with fluorine based chemistry but not chlorine based chemistry. Quartz may be used with oxygen or chlorine based chemistry but not fluorine based chemistry. Aluminum nitride may be used in any chemistry.

In some embodiments, a deformable layer 214 may be disposed between the coil antenna 212 and the dielectric tube 202 to ensure a good thermal conduction path between the coil antenna 212 and the dielectric tube 202. Good thermal conduction path between the coil antenna 212 and the dielectric tube 202 helps cool the dielectric tube 202 since the coil antenna 212 may have a coolant flowing therethrough. The deformable layer 214 may be made of an electrically insulating and thermally conductive material, such as silicon rubber.

To maintain spacing of the turns 213 of the coil antenna 212, a potting material 220 may be utilized to surround the coil antenna 212. The potting material 220 may be made of an electrically insulating and thermally conductive material. The potting material 220 may also transfer heat from the dielectric tube 202 to the coolant flowthrough the coil antenna 212. The terminals 216, 215a, 215b, 218, and the metal connector 221 may be exposed and not covered by the potting material 220. In some embodiments, a cover 222 may be disposed around the potting material 220. The cover 222 may be a thin plastic material, such as polycarbonate.

A first flange 224 and a second flange 226 may be provided at respective ends of the dielectric tube 202 to facilitate coupling the plasma source 100 with conduits, such as the foreline 192 and the exhaust conduit 194. A seal 228, such as an O-ring, may be provided between the respective first and second flanges 224, 226 and the straight end portions 208, 210, respectively. In some embodiments, at least one of the first and second flanges 224, 226 may be cooled. For example, a coolant channel 242 may be provided in the first and second flanges 224, 226 to facilitate circulating a coolant therethrough.

Figure 2B:
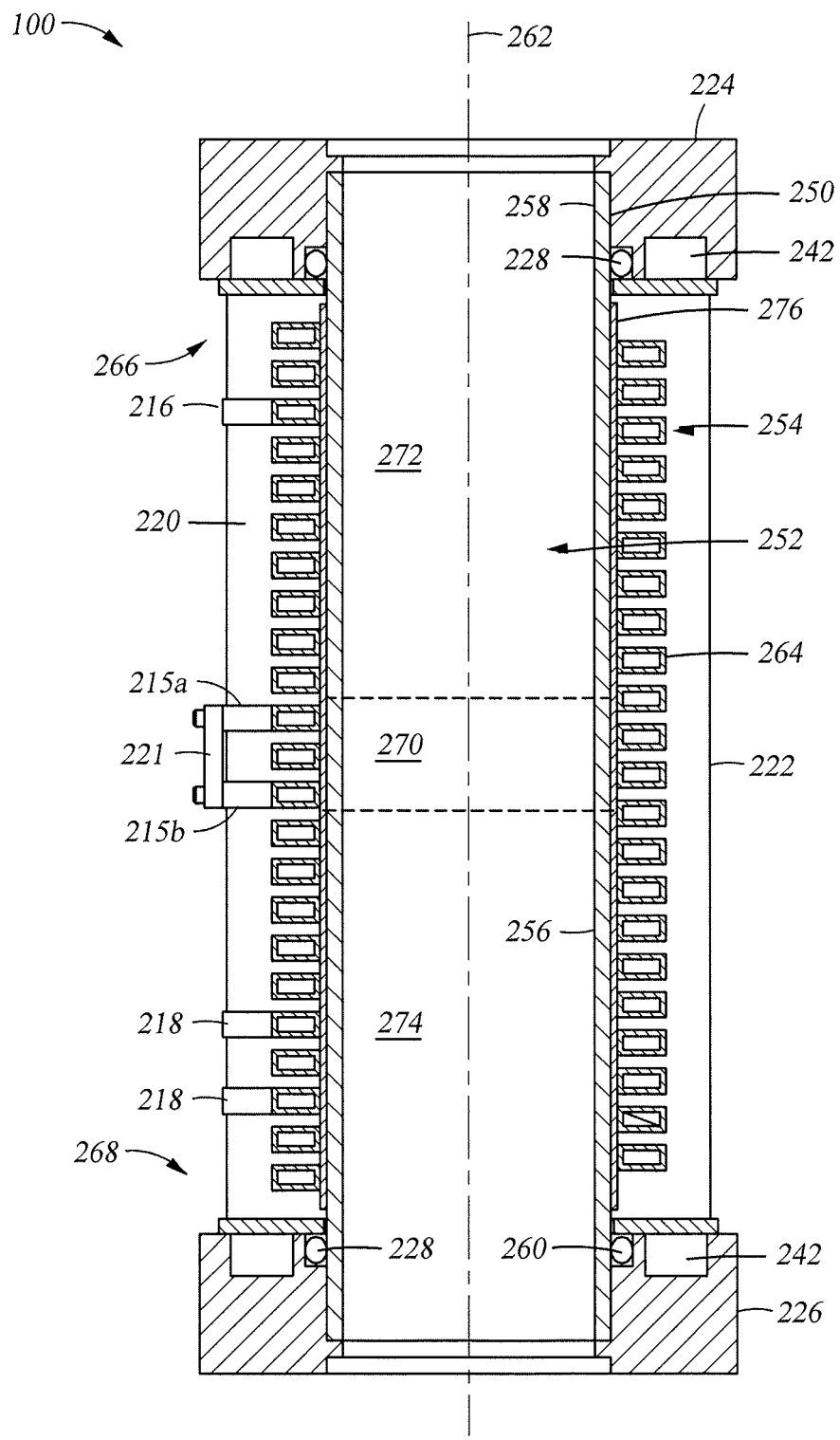

FIG. 2B is a cross sectional side view of the plasma source 100 of FIG. 1, according to another embodiment described herein. As shown in FIG. 2B, the plasma source 100 includes a dielectric tube 250 having an inner volume 252 and a coil antenna 254 surrounding the dielectric tube 250 to inductively couple RF energy into the inner volume 252 during processing to excite compounds traveling therethrough. The dielectric tube 250 may have a cylindrical side wall 256 that terminates with a first end portion 258 and a second end portion 260. The cylindrical side wall 256 may be substantially parallel to a central axis 262 of the dielectric tube 250. The end portions 258, 260 may serve the same purpose as the straight end portions 208, 210 shown in FIG. 2A. The dielectric tube 250 may be made of the same material and may have the same thickness as the dielectric tube 202.

The coil antenna 254 may include a plurality of turns 264 and may be similar to the coil antenna 212, except that the coil antenna 254 has a cylindrical shape while the coil antenna 212 has a conical shape. The one or more terminals 216 may be disposed at a first end 266 of the coil antenna 254 to facilitate coupling RF power to the coil antenna 254. The one or more second terminals 218 may be disposed at a second end 268 of the coil antenna 254 to facilitate coupling RF power to the coil antenna 254. The second terminals 218 may be also coupled to ground, or another reference potential. In one embodiment, the first terminals 216 and the second terminals 218 are connected to the power source 110. The third terminal 215a may be connected to a turn of the coil antenna 254, such as the $10^{th}$ turn, and the fourth terminal 215b may be connected to another turn of the coil antenna 254, such as the $12^{th}$ turn. The metal connector 221 may be connected to the third terminal 215a and the fourth terminal 215b in order to short two turns (first turn between $10^{th}$ and $11^{th}$ turns and second turn between $11^{th}$ and $12^{th}$ turns). The third terminal 215a, the fourth terminal 215b, and the metal connector 221 are used to short one or more turns of the coil antenna 254. Other methods and devices may be used to short one or more turns. A field 270, a first plasma zone 272, and a second plasma zone 274 may be formed by the same method for forming the field 230, the first plasma zone 232, and the second plasma zone 234 shown in FIG. 2A.

In some embodiments, a deformable layer 276 may be disposed between the coil antenna 254 and the dielectric tube 250 to ensure a good thermal conduction path between the coil antenna 254 and the dielectric tube 250. The deformable layer 276 may be made of the same material as the deformable layer 214. The plasma source 100 having the dielectric tube 250 may also include the potting material 220, the cover 222, the first flange 224, the second flange 226, coolant channels 242, and seals 228.

FIG. 3 is a perspective view of the coil antenna 212 according to embodiments described herein. FIG. 3 illustrates an embodiment with non-adjacent turns shorted. As shown in FIG. 3, the third terminal 215a, the fourth terminal 215b, and the metal connector 221 may be used to short two turns 213a, 213b. As shown in FIG. 3, the turns 213a and 213b have a turn between them, so the turns 213a and 213b are not adjacent. Again any one or more pairs of turns of the coil antenna 212 may be connected with an electrical grade conductive material in order to reduce the inductance of the coil antenna 212. The coil antenna 212 may also include a coolant inlet 302 and a coolant outlet 304 for flowing a coolant into and out of the coil antenna 212. A coolant source (not shown) may be coupled to the coil antenna 212. In some embodiments, the coil antenna may be cylindrical, such as the coil antenna 254.

Figure 4:
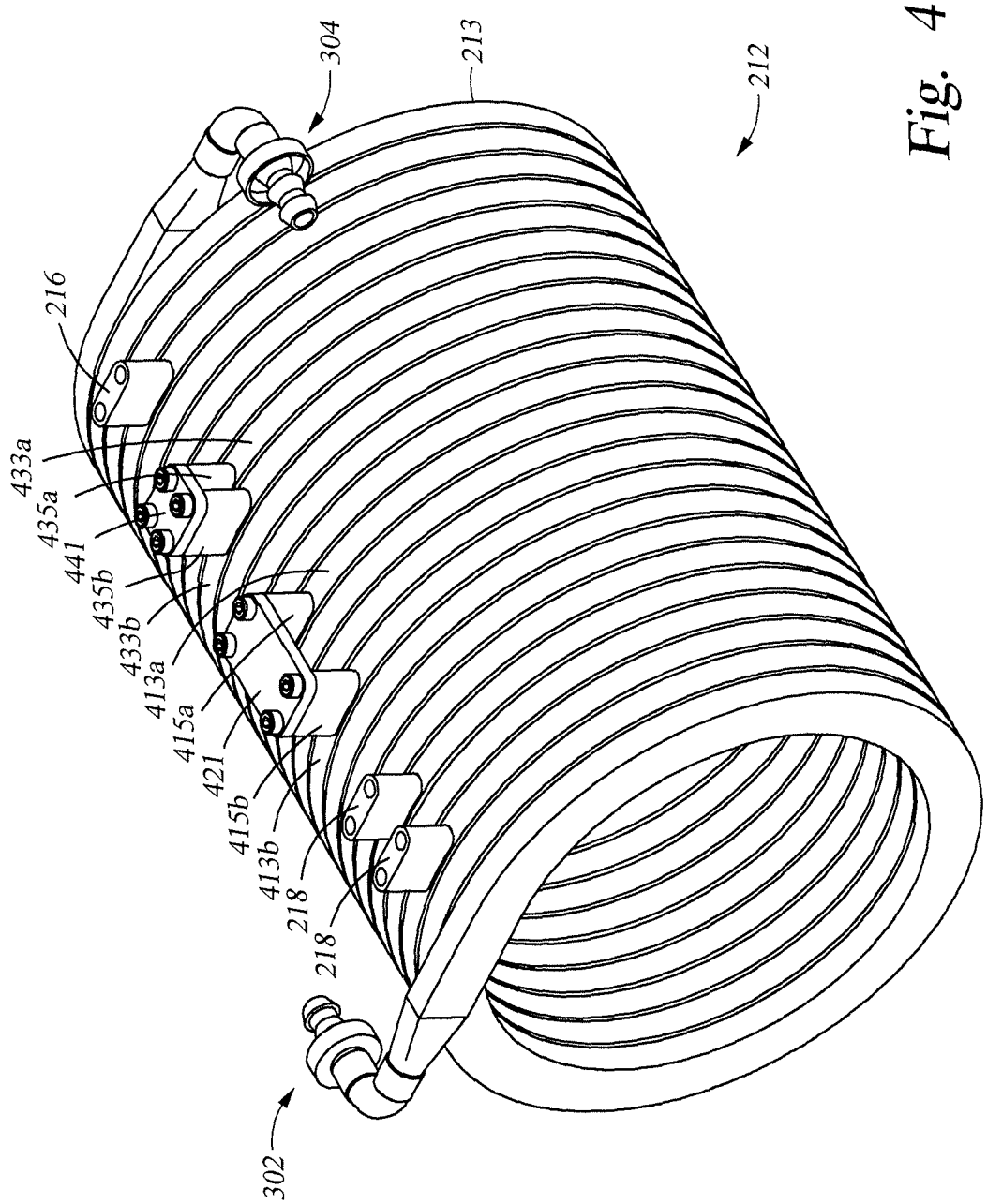
FIG. 4 is a perspective view of a coil antenna of the plasma source of FIG. 1, according to another embodiment described herein.

FIG. 4 is a perspective view of the coil antenna 212 according to another embodiment described herein. As shown in FIG. 4, the coil antenna 212 may include terminals 415a, 415b disposed on turns 413a, 413b, respectively. A metal connector 421 may be electrically coupled to the terminals 415a, 415b in order to short three turns of the coil antenna 212 (three turns between turns 413a and 413b). In some embodiments, terminals 435a, 435b may be disposed on adjacent turns 433a, 433b, respectively. A metal connector 441 may be electrically coupled to the terminals 435a, 435b in order to short one turn of the coil antenna 212 (one turn between turns 433a and 433b). The terminals 415a, 415b, 435a, 435b may be made of the same material as the terminals 215a, 215b, and the metal connectors 421, 441 may be made of the same material as the metal connector 221. As shown in FIG. 4, coil antenna 212 includes two pairs of turns that are connected by an electrical grade conductive material at different locations of the coil antenna 212, which leads to three plasma zones within the dielectric tube 202. In some embodiments, coil antenna 212 includes one pair of turns that are connected by an electrical grade conductive material, such as turns 413a, 413b connected by the metal connector 421, or turns 435a, 435b connected by the metal connector 441. In some embodiments, the coil antenna may be cylindrical, such as the coil antenna 254.

A plasma source having a coil antenna and a dielectric tube is disclosed. The coil antenna has a plurality of turns and at least two turns are shorted in order to reduce the inductance of the coil antenna. Reduced inductance leads to higher power supplied to the coil antenna, which improves DRE in abatement process.

Alternatively, the plasma source may be used as a remote plasma source upstream of a vacuum processing chamber for providing a remote plasma into the vacuum processing chamber. In this application the gases introduced into the plasma source and the exhaust is a plasma having ions and/or radicals, such as processing species or cleaning species, that are used for processing inside the vacuum processing chamber.

While the foregoing is directed to embodiments of the present invention, other and further embodiments of the invention may be devised without departing from the basic scope thereof, and the scope thereof is determined by the claims that follow.

The invention claimed is:

1. A plasma source, comprising:
   a dielectric tube;
   a coil antenna surrounding the dielectric tube, wherein the coil antenna comprises a plurality of turns having a first group of turns, a second group of turns, and a third group of turns;
   a first terminal coupled to a first end of the coil antenna and configured to couple to a power source;
   a second terminal coupled a second end of the coil antenna and configured to couple to the power source or ground;
   a third terminal coupled to a first turn of the second group of turns of the coil antenna, the third terminal disposed between the first and second terminals;
   a fourth terminal coupled to a second turn of the second group of turns of the coil antenna, the fourth terminal disposed between the second and third terminals; and
   a first electrically conductive connector connected to the third and fourth terminals, the first electrically conductive connector electrically shorting the first and second turns of the second group of turns, wherein the first electrically conductive connector is disposed between the first terminal and the second terminal and configured to form a buffer field between the first and second turns of the second group of turns separating a first plasma from a second plasma when power is applied to the coil antennae.

2. The plasma source of claim 1, wherein the first pair of the first and second turns comprises two adjacent turns.

3. The plasma source of claim 1, wherein one or more turns of the plurality of turns are located between the first and second turns.

4. The plasma source of claim 1, wherein the dielectric tube comprises aluminum nitride, sapphire, or quartz.

5. The plasma source of claim 1, wherein the coil antenna is hollow and further comprises a coolant inlet and a coolant outlet.

6. An abatement system comprising a power source and the plasma source of claim 1.

7. A plasma source, comprising:
a dielectric tube;
a coil antenna surrounding the dielectric tube, wherein the coil antenna comprises a plurality of turns;
a first terminal connected to a first turn of the plurality of turns;
a second terminal connected to a second turn of the plurality of turns;
a first electrically conductive connector connected to the first terminal and the second terminal, wherein first electrically conductive connector is configured to form a buffer field separating a first plasma zone from a second plasma zone; and
a third terminal connected to a third turn of the plurality of turns;
a fourth terminal connected to a fourth turn of the plurality of turns; and
a second electrically conductive connector connected to the third terminal and the fourth terminal.

8. The plasma source of claim 7, wherein the first turn of the plurality of turns is adjacent to the second turn of the plurality of turns.

9. The plasma source of claim 7, wherein one or more turns of the plurality of turns are located between the first turn of the plurality of turns and the second turn of the plurality of turns.

10. The plasma source of claim 7, wherein the dielectric tube comprises aluminum nitride, sapphire, or quartz.

11. The plasma source of claim 7, wherein the second electrically conductive connector comprises copper, aluminum, or brass.

12. The plasma source of claim 7, wherein the coil antenna is hollow and further comprises a coolant inlet and a coolant outlet.

13. An abatement system comprising a power source and the plasma source of claim 7.

14. A plasma source, comprising:
a dielectric tube; and
a coil antenna surrounding the dielectric tube, wherein the coil antenna is configured to form two or more distinct plasma zones in the dielectric tube, wherein each of the two or more distinct plasma zones are separated by a respective buffer field formed by electrically shorting one or more turns of the coil antenna with an electrically conductive connector.

15. The plasma source of claim 14, wherein the coil antenna comprises a plurality of turns.

16. The plasma source of claim 15, wherein the plurality of turns comprises a first portion surrounding a first plasma zone of the two or more plasma zones and a second portion surrounding a second plasma zone of the two or more plasma zones.

17. The plasma source of claim 16, wherein the plurality of turns further comprises a third portion located between the first portion and the second portion.

18. An abatement system comprising a power source and the plasma source of claim 14.

* * * * *